US012701340B2

(12) United States Patent
Nikolaev et al.

(10) Patent No.: US 12,701,340 B2
(45) Date of Patent: Aug. 4, 2026

(54) SEMICONDUCTOR DIGITAL PHOTOMULTIPLIER PHOTON COUNTER AND IMAGER AND RELATED TECHNOLOGY

(71) Applicant: ScReIn GmbH, Hamburg (DE)

(72) Inventors: Konstantin Nikolaev, Zug (CH); Andrey Saveliev, Hamburg (DE); Valeriy Savelyev, Hamburg (DE); Andrey Kunatbaev, Houston, TX (US)

( * ) Notice: Subject to any disclaimer, the term of this patent is extended or adjusted under 35 U.S.C. 154(b) by 242 days.

(21) Appl. No.: 18/351,642

(22) Filed: Jul. 13, 2023

(65) Prior Publication Data

US 2024/0031705 A1 Jan. 25, 2024

(30) Foreign Application Priority Data

Jul. 13, 2022 (EP) .................................... 22184792

(51) Int. Cl.
*H04N 25/773* (2023.01)
*G01T 1/24* (2006.01)
(Continued)

(52) U.S. Cl.
CPC ........... *H04N 25/773* (2023.01); *G01T 1/248* (2013.01); *H04N 25/63* (2023.01); *H04N 25/779* (2023.01);
(Continued)

(58) Field of Classification Search
CPC .... H04N 25/773; H04N 25/63; H04N 25/779; H04N 25/78; G01T 1/248; H10F 30/225; H10F 39/18; H10F 77/959
See application file for complete search history.

(56) References Cited

U.S. PATENT DOCUMENTS

| | | | |
|---|---|---|---|
| 2008/0308738 A1 | 12/2008 | Li et al. | |
| 2013/0193546 A1 | 8/2013 | Webster et al. | |

(Continued)

FOREIGN PATENT DOCUMENTS

| | | | |
|---|---|---|---|
| EP | 4307655 A1 | 1/2024 | |
| WO | 20160034581 A1 | 1/2016 | |

OTHER PUBLICATIONS

Extended European Search Report for European Patent Application No. 22184792.4, European Patent Office, 80298 Munich, Germany, dated Dec. 14, 2022.

(Continued)

*Primary Examiner* — Nicholas G Giles
(74) *Attorney, Agent, or Firm* — Thomas E. Lees, LLC

(57) ABSTRACT

A breakdown-avalanche photon sensors array is shown, which is implemented in CMOS technology, wherein the breakdown-avalanche photon sensors array has single photon sensitivity, comprising: a semiconductor substrate; and an epitaxial layer, which is located above the semiconductor substrate; and a breakdown-avalanche photon sensor, which is located within the epitaxial layer, wherein the breakdown avalanche photon sensor comprises: a guard ring and a quenching element, which is electrically connected to the breakdown-avalanche photon sensor, wherein the quenching element is configured for quenching the breakdown-avalanche photon sensor after detection of a photon. Furthermore, a digital breakdown-avalanche photon sensor, a digital breakdown-avalanche photon sensors array and a digital photomultiplier imager are shown.

15 Claims, 3 Drawing Sheets

(51) Int. Cl.

| | |
|---|---|
| ***H04N 25/63*** | (2023.01) |
| ***H04N 25/779*** | (2023.01) |
| ***H04N 25/78*** | (2023.01) |
| ***H10F 30/225*** | (2025.01) |
| ***H10F 39/18*** | (2025.01) |
| ***H10F 77/00*** | (2025.01) |

(52) U.S. Cl.

CPC ........... *H04N 25/78* (2023.01); *H10F 30/225* (2025.01); *H10F 39/18* (2025.01); *H10F 77/959* (2025.01)

(56) References Cited

U.S. PATENT DOCUMENTS

2017/0131143 A1* 5/2017 Andreou .............. H04N 25/773
2018/0033895 A1* 2/2018 Mazzillo ............... H10F 39/806

OTHER PUBLICATIONS

Communication Under Rule 71(3)EPC Intention to Grant for European Patent Application No. 22184792.4, European Patent Office, 80298 Munich, Germany, dated Jun. 21, 2024.
Transmission of the Certificate for a European Patent Pursuant to Rule 74 EPC for European Patent Application No. 22184792.4, European Patent Office, 80298 Munich, Germany, dated Dec. 3, 2024.

* cited by examiner

SEMICONDUCTOR DIGITAL PHOTOMULTIPLIER PHOTON COUNTER AND IMAGER AND RELATED TECHNOLOGY

CROSS-REFERENCE TO RELATED APPLICATIONS

This application claims priority to European Patent Application Number EP22184792.4 entitled SEMICONDUCTOR DIGITAL PHOTOMULTIPLIER PHOTON COUNTER AND IMAGER AND RELATED TECHNOLOGY by Konstantin Nikolaev et al., filed on Jul. 13, 2022, the entirety of which is hereby incorporated by reference.

BACKGROUND

Field of the Invention

The present invention relates to a breakdown-avalanche photon sensor with a quenching element,—a so-called breakdown-avalanche photon sensor. Moreover, the present invention relates to a direct principle for converting photons into digital electronic signals by a breakdown-avalanche photon sensor. Photodetection up to single photons with high efficiency and fidelity is possible. Furthermore, the present invention relates to a two-dimensional array of breakdown-avalanche photon sensors as a digital photomultiplier photon counter of low photon flux in digital form and a digital photomultiplier imager, especially as a semiconductor digital photomultiplier imager with internal photomultiplication. The related electronic component represents the digital memory for storing and processing the images in digital form. The related technology is Complementary Metal Oxide Semiconductor Technology (CMOS). The applicability for the present invention is in the fields of systems for detection of extremely low photon fluxes and digital photoimaging systems in general in both civil and military applications.

BACKGROUND OF THE INVENTION

Detection of low photon flux is employed in many applications, such as medical diagnostic imaging systems, especially positron emission tomography (PET), light detection and ranging (LIDAR) and other. Photoimaging in low light conditions is important in homeland security and other critical areas in special conditions. Important considerations in the selection of photon flux detection and photoimaging systems for low photon flux are sensitivity, linearity and dynamic range, accuracy, recovery time, and background conditions. A high sensitivity may be the most important characteristic, as it allows for high performance detection—e.g., up to single photon sensitivity at room temperature and high signal-to-noise ratios—and reduces the requirements for the processing electronics. Linearity and high dynamic range are important towards providing accurate measurements of the low photon flux, for example in medical imaging diagnostic systems such as Positron Emission Tomography (PET). High accuracy measurements permit a discrimination of gamma-rays that have been scattered within a material such as a patient's body. Scattered gamma-rays provide less reliable information about the distribution of gamma-ray sources in the patient's body than unscattered gamma-rays. Short recovery times are important towards achieving good performance in high-dense gamma-ray environments, such as in cardiac scans with short-lived radioisotopes (e.g., Rb-82). Short response times are important in order to accurately measure the gamma-ray detection time, which is of particular interest in PET scanner operations, where locations of gamma ray emissions are determined by the coincident detection of gamma rays by a pair of detectors. Background conditions can contribute due to "dark current events," such as the ones generated by thermally created carriers inside a sensitive area. A dark current event is typically caused by defects in, or thermal variations experienced by a photo detector. Dark current events often cannot be distinguished from the intended signal generated by the detection of a photon in a micro-cell. The dark rate is best kept at a minimum in order to yield high signal-to-noise ratio.

Other important considerations for many low intensity radiation detection applications include operation conditions, stability, expected working conditions (e.g., a high electromagnetic and radiation field environment), physical size and fabrication cost. Operation conditions such as low bias voltage stability is important, especially for invasive devices (e.g., intra-operative cameras), in order to reduce the possibility of electric shock to a patient, sensitive technology (e.g., space technology), and mobile systems. The photodetector fabrication cost represents a significant fraction of the expense associated with medical imaging systems.

Low intensity photon flux detection generally employs conventional photomultiplier tubes (PMT) and the related hybrid photon detector (HPD) technology. These technologies have several features, such as high gain (e.g., one million or higher), good linearity, and a low dark current. However, these conventional technologies also have disadvantages, such as large size, high voltage bias, sensitivity to ambient magnetic fields, complicated technology, and high expenses, such that the development of a modern photo-Imager based on this technology is practically excluded.

Semiconductor technologies based avalanche photosensor can offer linear amplification with wide dynamic ranges, but at low amplification gain (e.g., 100), low sensitivity and show a rather poor signal-to-noise ratio at room temperature. A single photon avalanche photodetector (SPAD) may operate in a high-gain avalanche mode by increasing the bias voltage and implement the quenching element, take advantage of this high-amplification operational mode to detect single photons of light. However, the operation of the SPAD in the avalanche-breakdown mode with a high gain, results in the loss of proportional measurements of the photon flux, since the electrical signal generated by the avalanche discharge does not depend on the number of absorbed photons and does not allow the creation of multiphoton detection and a photo-imager.

The publication of V. Golovin and V. Saveliev, entitled "Novel type of avalanche photodetector with Geiger mode operation," Nuclear Instruments and Methods in Physics Research" 518 (2004), pp. 560-564 discloses as a two-dimensional array of breakdown avalanche photodetectors with implemented quenching mechanisms and a common electrode, referred to as a Silicon Photomultiplier.

BRIEF SUMMARY

The invention relates in a first aspect to a breakdown-avalanche photon sensors array. The breakdown-avalanche photon sensors array can be configured to detect photon flux and photo-images. The breakdown-avalanche photon sensors array may have the highest sensitivity up to the physical limit—a single photon detection. The breakdown-avalanche photon sensors array may be implemented in CMOS compatible technology.

The breakdown-avalanche photon sensors array comprises a semiconductor substrate and an epitaxial layer, which is located above the semiconductor substrate. Both, the semiconductor substrate and the epitaxial layer, may be of a silicon material or other semiconductor materials. The semiconductor substrate and the epitaxial layer may be doped leading to the same type of conductivity or the epitaxial layer may be doped to the different type of conductivity, as standard definition of p or n type of conductivity. As example the semiconductor substrate may be highly p-doped, wherein the epitaxial layer may be low p-doped, which is followed by the CMOS technology.

The breakdown-avalanche photon sensors array may comprise differently doped layers, for instance a lower layer which is p-doped and an upper layer which is highly n+-doped. In other words these two layers with different types of conductivity may form a pn-junction with a specific doping concentrations profile, which may correspond to the possibility of the avalanche process realization. The pn-junction may be located within the epitaxial layer in accordance to CMOS technology. Under the reverse bias in the pn-junction a depleted region may be formed which comprises a photosensitive and breakdown-avalanche amplification region. The amplification region may show high intrinsic amplification of the photoelectrons in breakdown-avalanche process.

Further, the breakdown-avalanche photon sensors array comprises a breakdown-avalanche photon sensor, which comprises a quenching element, which is electrically connected to an upper area of the breakdown avalanche photon sensor. The quenching element may be passive, like a quenching resistor, outside of epitaxy layer or it may be active, like an active circuit inside the epitaxy layer, in accordance with CMOS technology. The quenching element is configured for quenching, alternatively or additionally suppress the breakdown avalanche process, after detection of a photon.

The breakdown-avalanche photon sensor may operate in a breakdown avalanche type (Geiger-mode type) mode of operation. A photon entering a photosensitive area of the breakdown-avalanche photon sensor may be absorbed. This absorption of the photon may generate an electron-hole pair inside the breakdown-avalanche photon sensor. This absorption may take place within the depleted region (amplification region) of the pn-junction under reverse bias. Due to a very high electric field within the amplification region, due to a reverse bias applied to the pn-junction, the charge carrier may generate a large number of identical charged charge carriers via an avalanche process. As the avalanche process increases, it may result in a breakdown-avalanche process. By combining the breakdown-avalanche photon sensor with the quenching element, a control under breakdown-avalanche process may be achieved and significant intrinsic amplification may be achieved, and under these conditions single photon sensitivity may be reached at the room temperature conditions. When the pn-junction avalanche breaks down, a large amount of charge carriers may be generated through the breakdown avalanche process. This charge may be transported, as an electric current under the reverse bias, primarily through the quenching circuit, which may have an effective high resistance and due to the high current reducing the bias on the pn-junction and quenching the breakdown-avalanche process. Due to the quenching of the breakdown-avalanche process, remaining charge carriers may be transported out of the avalanche region of the pn-junction and thus, the breakdown-avalanche photon sensor may recover after the photon detection and may be ready to detect the next photon.

Further, for the purposes to improve the quality, the breakdown-avalanche photon sensor may comprise a guard ring, and the guard ring may be configured for the suppression of the breakdown-avalanche processes at the edges of the breakdown-avalanche photon sensor. For instance, this may be a n-doped region—guard ring around the n+ layer of the pn-junction. Due to less doping of the guard ring region compared to the n+ region, especially less doping than the upper layer of the pn-junction, breakdown-avalanche may be less likely to occur at or near the guard ring area, as the electric field may be weaker at or near the guard ring area compared to the electric field within a central region of the pn-junction.

For the purposes to improve the quality of arrays of breakdown-avalanche photon sensors array, it further comprises optical protection trenches between the breakdown-avalanche photon sensors. The optical protection trenches may be located around the breakdown-avalanche areas of the breakdown-avalanche photon sensors and the optical protection trenches may be configured to suppress optical crosstalk to neighboring breakdown-avalanche photon sensors. The breakdown-avalanche area of the breakdown-avalanche photon sensor may comprise a photo sensitive area of the breakdown-avalanche photon sensor. The optical protection trench may define an outer boundary of the photo sensitive area of the breakdown-avalanche photon sensor. The optical protection trenches may be located between the photo sensitive areas of different breakdown-avalanche photon sensors. Each breakdown-avalanche photon sensor may comprise exactly one optical protection trench. The optical protection trench may comprise a CMOS technology shallow trench isolation (STI). The optical protection trench may be configured to suppress optical crosstalk to another breakdown-avalanche photon sensors especially to a photosensitive area of another breakdown-avalanche photon sensors in particular neighboring breakdown-avalanche photon sensors. By providing the optical protection trenches, it may be ensured that only photons directly absorbed by the breakdown-avalanche photon sensor may cause a breakdown-avalanche process. Thereby, photons absorbed by another breakdown-avalanche photon sensors may not cause a breakdown-avalanche in said breakdown avalanche photon sensor due to the optical protection trench.

According to another embodiment of the invention, the photosensitive area may be defined by a pn-junction area of the breakdown-avalanche photon sensor in at least a portion of the breakdown-avalanche photon sensor. The photosensitive area may define an upper end of the breakdown-avalanche photon sensor in the central portion of the breakdown-avalanche photon sensor, wherein metal contacts or optical isolation may define another upper end of the breakdown-avalanche photon sensor in the outer portion of the breakdown-avalanche photon sensor.

The optical protection trenches may be placed further from the photosensitive area of the breakdown-avalanche photon sensor in the epitaxial layer than the pn-junction. Starting from the upper end of the breakdown-avalanche photon sensor, the optical protection trench may be placed further than the pn-junction of the breakdown-avalanche photon sensor. The optical protection trench may suppress crosstalk especially in the avalanche region, i.e., the amplification region of the breakdown-avalanche photon sensor with respect to neighboring breakdown-avalanche photon sensors. This may increase the accuracy of the two-dimensional array of breakdown-avalanche photon sensors due to suppressed optical crosstalk from neighboring breakdown-avalanche photon sensors.

A second aspect of the present invention relates to a digital breakdown-avalanche photon sensor.

In accordance the earlier aspects of invention, the breakdown-avalanche process in the breakdown-avalanche photon sensor may be non-linear, nonproportional to the incoming photon flux, because sensitive to the single photons, and producing the practically digital signal corresponding to the single photon detected.

The digital breakdown-avalanche photon sensor may comprise a breakdown-avalanche photon sensor according to embodiments of the previous aspect of the invention. The digital breakdown-avalanche photon sensor may further comprise processing electronics, comprising a digital memory, for instance 1-bit electronic digital memory. The digital breakdown avalanche photon sensor may comprise an input discriminator. The discriminator may be configured to receive a signal from the breakdown-avalanche photon sensor and form, or determine, a discrete signal, especially a binary signal. The digital memory may be electrically connected to the breakdown-avalanche photon sensor through the discriminator. Alternatively, the memory may be electrically connected to the breakdown-avalanche photon sensor directly.

Upon photodetection by the breakdown-avalanche photon sensor, the breakdown-avalanche photon sensor may be configured to generate a signal and send the signal to the memory via the discriminator. The quenching element may be configured to control generation of the signal and the quenching element may also be configured to control sending the signal to the discriminator. This control of generation and sending of the signal may also be called gating. The discriminator may be configured to perform digitalization, especially direct digitalization, of the generated signal. The generated signal may comprise an analogue current and the discriminator may be configured to digitalize this analogue current. Furthermore, the discriminator may be configured to send the digitalized signal to the memory. The digitalized signal may comprise either of the values 0 and 1. The memory may be configured to store the digitalized signal as data information about detecting of at least one photon by digital breakdown avalanche pixel photon sensor.

According to another embodiment, the breakdown-avalanche photon sensor, the digital memory, either with the discriminator or without the discriminator, are implemented on the same epitaxial layer, in accordance with the CMOS technology. By implementing the breakdown-avalanche photon sensor and the memory with discriminator or not on the same epitaxial layer, a simplified production process of the digital circuit may be used during production of the digital circuit unit. Hereby, production costs of the digital circuit unit may be lowered.

A third aspect of the invention relates to a digital breakdown-avalanche photon sensors array comprising at least a one-dimensional array of digital breakdown-avalanche photon sensors according to any embodiment of the second aspect, wherein processing electronics of the digital breakdown-avalanche photon sensors array are electrically connected with each other. The memories of the digital breakdown-avalanche photon sensors may be electrically connected with each other. The processing electronics of the digital breakdown-avalanche photon sensors array may be implemented within the epitaxial layer in accordance with CMOS technology.

A fourth aspect of the invention relates to a digital photomultiplier photon counter, which comprises a digital breakdown-avalanche photon sensors array according to an embodiment of the third aspect of the invention, and digital processing electronics providing as output information the number of photons detected at a particular time.

A digital photomultiplier photon counter may comprise at least a one-dimensional array of digital breakdown-avalanche photon sensors according to an embodiment of the second aspect of the invention and digital processing electronics. The digital photomultiplier photon counter may for instance comprise a one- or two-dimensional array of the digital breakdown-avalanche photon sensors with digital processing electronics.

The digital photomultiplier photon counter may comprise the processing electronics, at least a few processing electronics, for instance a digital control unit, a digital data bus and an output readout buffer. The digital processing electronics of the digital photomultiplier photon counter may be electrically connected with each other. The processing electronics may be connected with each other, such that communication between processing electronics of the digital breakdown-avalanche photon sensors array may be possible. For instance, all processing electronics may be connected via their memory to a digital information bus and further to digital output buffer. Additionally, all processing electronics may be connected to a common ground.

The digital photomultiplier photon counter may provide a photosensitive structure, wherein single breakdown-avalanche photon sensors with processing electronics may each be configured for detecting a photon flux. In accordance with the first aspect of invention, due to the optical protection trenches of each breakdown-avalanche photon sensors array of each digital breakdown-avalanche photon sensors array, optical crosstalk suppression may lead to an improved detection quality of the photons incoming onto the digital photomultiplier photon counter. 1-bit memory of each digital breakdown-avalanche photon sensor may provide a threshold-based binary digital output indicating whether or not the breakdown-avalanche photon sensor has detected a photon and entered a breakdown-avalanche process. The threshold may be corresponding to the current through the breakdown-avalanche photon sensor, wherein below the threshold of the discriminator of digital memory, the output of the corresponding discriminator or digital memory may be 0, and above the threshold, the output of the corresponding discriminator or memory may be 1, indicating a photon detection in digital form. Furthermore, the digital breakdown avalanche photon sensor may provide at least one signal indicating the photon detection by the digital breakdown-avalanche photon sensors array. Herein, for each digital memory of the digital breakdown-avalanche photon sensors array, it may be counted how many digitalized signals of the discriminators or memories changed its value, especially from 0 to 1, indicating the number of detected photons by the corresponding digital breakdown-avalanche photon sensors array. All memories of all the digital breakdown-avalanche photon sensors array may be connected via a digital data bus to the output digital buffer, which may be connected via digital output busses to a final digital output bus. Additionally, for each detected photon, a timestamp may be saved on the memory of the corresponding output memory buffer for the external output information readout.

According to another embodiment, the digital processing electronics of the digital photomultiplier photon counter may be implemented on the same epitaxial layer as the digital breakdown-avalanche photon sensors array. All digital processing electronics units of the digital breakdown-avalanche photon sensors array may be implemented on the same epitaxial layer. The processing electronics of the digital breakdown-avalanche photon sensors array may be implemented on the epitaxial layer in a collective production process, in accordance CMOS technology. By implementing digital processing electronics on the epitaxial layer, production complexity and thus production costs of the digital breakdown-avalanche photon sensors array may be lowered.

A fifth aspect of the present invention relates to a digital imaging at low photon conditions, especially a digital photomultiplier imager. The digital photomultiplier imager may provide the information of the photons detected and spatial information for the digital imaging forming. The digital photomultiplier imager may provide a single-photon space detection structure, wherein the photodetection and digitalization of the detected signal may be performed pixel-wise. After pixel-wise digitalization of the detected signal, all digitalized signals may be read out by the output readout electronic unit and information may be stored in the output readout electronic unit centrally.

The digital photomultiplier imager may comprise a digital breakdown avalanche photon sensors array according to an embodiment of the first aspect of the present invention and processing electronics. A physical position of each digital breakdown-avalanche photon sensor within the digital photomultiplier imager may provide a spatial information of a photon detected by one of the digital breakdown-avalanche photon sensors. The address information may be defined by the processing electronics. In a two-dimensional digital breakdown-avalanche photon sensors array, the address information may for instance comprise two values—row and columns indicating the spatial position of the digital breakdown-avalanche photon sensors in the two dimensional array.

The digital photomultiplier imager may further comprise processing electronics, at least readout electronics which may be electrically connected to a one- or two-dimension digital breakdown-avalanche photon sensors array. The digital breakdown-avalanche photon sensors array and processing electronics may be communicatively coupled by the digital data buses. The processing electronics may be configured to readout data information and address information from one- or two-dimensional digital breakdown-avalanche photon sensors array. The processing electronics may be configured to read from each digital memory of digital breakdown-avalanche photon sensors array. The digital photomultiplier imager may further comprise an output readout electronic unit, which may be electrically connected to the digital breakdown-avalanche photon sensors array via digital data buses. The output readout electronic unit, or output unit, may comprise an output digital register or an output readout memory. The output readout electronic unit and the digital breakdown-avalanche photon sensors array may be coupled communicatively. The output readout electronic unit may be configured to store data information and address information read from digital memories of digital breakdown-avalanche photon sensors array.

The processing electronics may further comprise the digital control unit. The digital control unit may comprise a controller of time sequences. The digital control unit may be configured to control reading data information time sequences from a digital breakdown-avalanche photon sensors array corresponding to determined address information. The digital control unit may be configured to control an information readout process from a digital breakdown-avalanche photon sensors array. The digital control unit may be configured to gate each digital memory of all digital breakdown-avalanche photon sensors for reading data information, and alternatively or additionally, digital address information. The digital photomultiplier imager may comprise a digital address unit, in one embodiment the imager may comprise more than one digital address unit. The digital address unit and the digital control unit may be electrically connected with each other, additionally they may be communicatively coupled with each other. The read data information, and alternatively or additionally, the read address information may be stored in the output digital readout unit.

According to another embodiment, the processing electronics comprise an address bus. The digital address unit may comprise digital decoders. The digital address unit may be communicatively coupled with each digital breakdown avalanche photon sensor, preferably in the digital breakdown-avalanche photon sensors array. The digital address unit may be configured to determine address information of digital memory of the digital breakdown-avalanche photon sensors array.

The processing electronics may further comprise the digital control unit. The digital control unit may comprise a controller of time sequences. The digital control unit may be configured to control reading data information time sequences from a digital breakdown-avalanche photon sensors array corresponding to determined address information. The digital control unit may be configured to control information readout process from a digital breakdown-avalanche photon sensors array. The digital control unit may be configured to gate each digital memory of all digital breakdown-avalanche photon sensors for reading data information, and alternatively or additionally, digital address information. The digital address unit and the digital control unit may be electrically connected with each other, additionally they may be communicatively coupled with each other. The read data information, and alternatively or additionally, the read address information may be stored in the output digital readout unit.

According to a further embodiment, the processing electronics further comprise at least one digital row decoder unit. The digital row decoder unit may be a digital electronic circuit. The digital row decoder unit may be electrically connected to rows of the digital breakdown-avalanche photon sensors array. The processing electronics may comprise more than one digital row decoder unit, wherein each digital row decoder unit may be electrically connected to rows of the digital breakdown avalanche photon sensors array, preferably wherein each digital row decoder unit may be electrically connected to all rows of the digital breakdown-avalanche photon sensors array.

The processing electronics may further comprise at least one digital column decoder unit, which may be an electrical circuit. The digital column decoder unit may be electrically connected to columns of the digital breakdown avalanche photon sensors array. The processing electronics may comprise at least two digital column decoder units, wherein each digital column decoder unit may be electrically connected to all columns of the digital breakdown-avalanche photon sensors array.

Each of the digital row and column decoder units may be connected to the digital breakdown-avalanche photon sensors array via one digital address unit.

The digital row decoder unit and the digital column decoder unit may each be electrically connected to the memories of the digital breakdown-avalanche photon sensors array. The digital control unit may be electrically connected to the at least one row decoder unit and to the at least one digital column decoder unit. The digital control unit may be configured to send a reading signal to the digital row and digital column decoder units corresponding to determined address information of digital breakdown-avalanche photon sensors. Upon sending the reading signal, the digital row decoder unit and digital column decoder unit may be configured to send a row and column strobe signal according to determined address information to the digital breakdown-avalanche photon sensors array. For instance, the reading signal may indicate reading the breakdown-avalanche photon sensor at position (1,1), wherein the first number of the tupel may define the row and the second number may define the column of the digital memory within the digital breakdown-avalanche photon sensors array. Hence, the digital row decoder unit may send a row strobe signal to the first row. Furthermore, the digital column decoder unit may be configured to send a column strobe signal to the first column, according to determined address information of the digital breakdown avalanche photon sensors array. According to the example, (1,1), the digital column decoder unit may be configured to send a column strobe signal to the first column. With these strobe signals, the digital breakdown-avalanche photon sensor with address information (1,1) may be read out.

By using a column and row decoder unit, each memory of all processing electronics of the imager may be read out by sending two signals, one from the digital row decoder unit indicating the row and one from the digital column decoder unit indicating the column. In the case of a two-dimensional digital breakdown-avalanche photon sensors array, unambiguous addressing of the intended memory may be possible with such an imager.

According to another embodiment, the processing electronics may be configured to read data from at least two areas of the digital breakdown-avalanche photon sensors array sequentially. For instance, the processing electronics may be configured to read data information from at least two memories. For instance, the digital control unit may be configured to send reading signals sequentially to the digital row decoder units and digital column decoder units. Hence, processing electronics may be read out sequentially throughout the digital breakdown-avalanche photon sensors array. The readout data information and alternatively or additionally the readout address information may be stored time-sorted in the digital output unit. Alternatively, or additionally, the processing electronics may be configured to read data information from processing electronics within a whole column and/or row of the digital breakdown-avalanche photon sensors array. Herein, each column and/or row of the digital breakdown-avalanche photon sensors array may comprise an accumulator, for instance a digital memory, for storing the readout data information of the corresponding memories of the processing electronics of the row and/or column. Such readout may be in parallel throughout the column and/or row. In yet another embodiment, readout may be sequentially within a row and/or column, wherein readout occurs for instance along a row of processing electronics, wherein an extra accumulator or memory is omitted but the memories of the processing electronics of the row and/or column are used. Herein, all data information of the preceding processing electronics may be stored in the current digital circuit unit until reaching the end of the row and/or column. Additionally, or alternatively, address information and/or the timestamp may be read out. Additionally, or alternatively, the number of detected photons may be read out from each memory of the processing electronics. By engineering cell recovery time of the digital breakdown-avalanche photon sensor and/or integration time, wherein the integration time period describes the time the current through the pn-junction is above the threshold for the discriminator to output 1 as digitalized signal, overflow of the memory storing the number of photons detected in a breakdown-avalanche photon sensor may be omitted.

By reading out the information of the processing electronics sequentially, fast read out of all memories of the imager may be feasible.

According to another embodiment, the digital output unit, which may comprise an output readout circuit, may be configured to suppress a dark rate of the breakdown-avalanche photon sensor. Dark rate or dark rate pulses may be due to thermally generated electrons in sensitive area, wherein these may be indistinguishable from detected single photons. Herein, signals detected from a breakdown-avalanche process may be indistinguishable regarding the trigger process for the breakdown-avalanche process. The initiation process may either be an absorption of a photon with the generation of an electron-hole pair or a thermally generated electron-hole pair. Those dark rate events may represent false signals which should be minimized. The output readout circuit may be connected to the digital breakdown-avalanche photon sensors array via one digital address unit.

Herein, the discriminator may be configured to abort integration over time of the current flowing through the breakdown-avalanche photon sensor due to the breakdown-avalanche process in case a trigger signal was false, i.e., optical crosstalk, thermal excitations, or dark rate. The integration may be aborted if the total current stays below a certain threshold for a selected time interval. Hereinafter, a reset sequence for the breakdown-avalanche photon sensor may be initiated for the preparation of the next incoming photon to be detected.

According to another embodiment, the processing electronics are implemented on the epitaxial layer, preferably on the same epitaxial layer as breakdown-avalanche photon sensors. The digital photomultiplier imager comprising the digital breakdown-avalanche photon sensors array, the processing electronics and the output unit may be implemented in CMOS technology on the same epitaxial layer. By implementing all components of the imager on the epitaxial layer, an easier production process may be used, which may lower the production costs of the imager.

DETAILED DESCRIPTION

Figure 1:
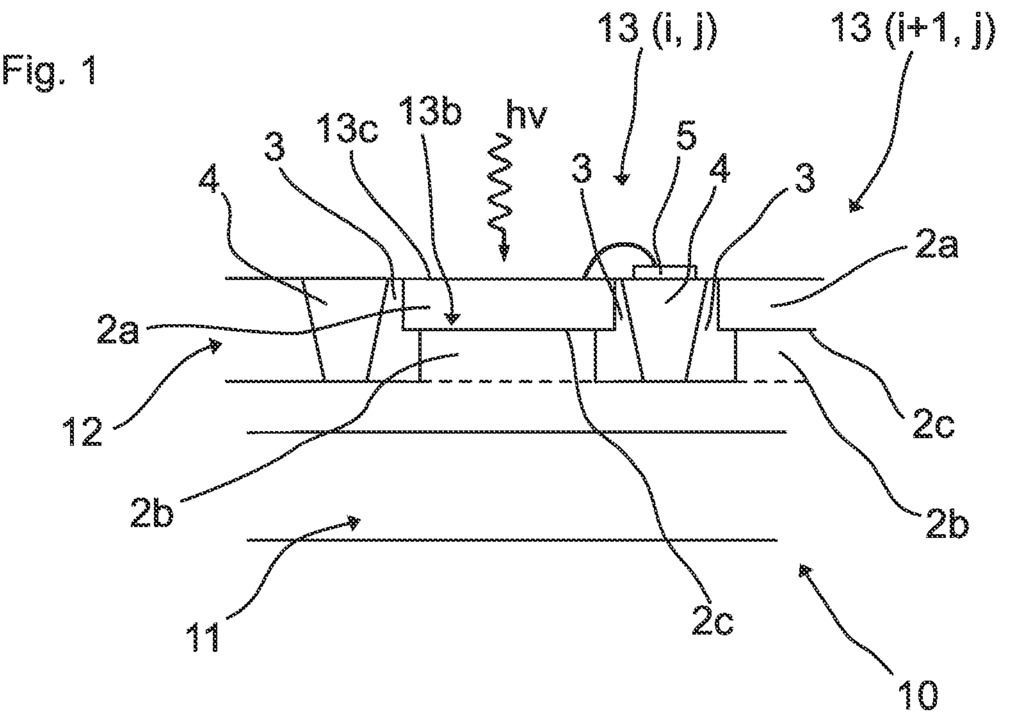
FIG. 1 shows a structural depiction of a part of a breakdown-avalanche photon sensors array according to an embodiment of the invention in a cross-section cutaway view.

FIG. 1 shows a structural depiction of part of breakdown-avalanche photon sensors array 10 according to an embodiment of the invention. The breakdown-avalanche photon sensors array 10 is shown in FIG. 1 in a side cross section view. From the bottom to the top of the breakdown-avalanche photon sensors array 10, the breakdown avalanche photon sensors array 10 comprises a semiconductor substrate 11, an epitaxial layer 12, and two breakdown-avalanche photon sensors 13, the (i, j) and the (i+1, j). The breakdown-avalanche photon sensor 13 comprises a lower layer 2*b* and an upper layer 2*a* within epitaxy layer 12, which form a sensitive breakdown-avalanche pn-junction 2*c*. Furthermore, the breakdown-avalanche photon sensor 13 comprises a guard ring 3 as a lower conductivity area on the edges of pn-junction 2*c*. Furthermore, the breakdown-avalanche photon sensor 13 comprises a quenching element 5. The quenching element 5 is passive, i.e., a passive resistor with high resistance, or active, i.e., a special electronic circuit. The quenching element 5, positioned above the epitaxy layer 12, is electrically connected to a top layer of the breakdown-avalanche photon sensor 13 and to a bias source on the other side. Moreover, the breakdown-avalanche photon sensor 13 comprises an optical protection trench 4, as shown in FIG. 1, with respect to the next breakdown-avalanche photon sensor 13. The breakdown-avalanche photon sensor 13 comprises a photosensitive area 13*b*, and furthermore an upper end 13*c* of the breakdown-avalanche photon sensor 13. Incoming photons are absorbed inside the photosensitive area 13*b*.

Figure 2:
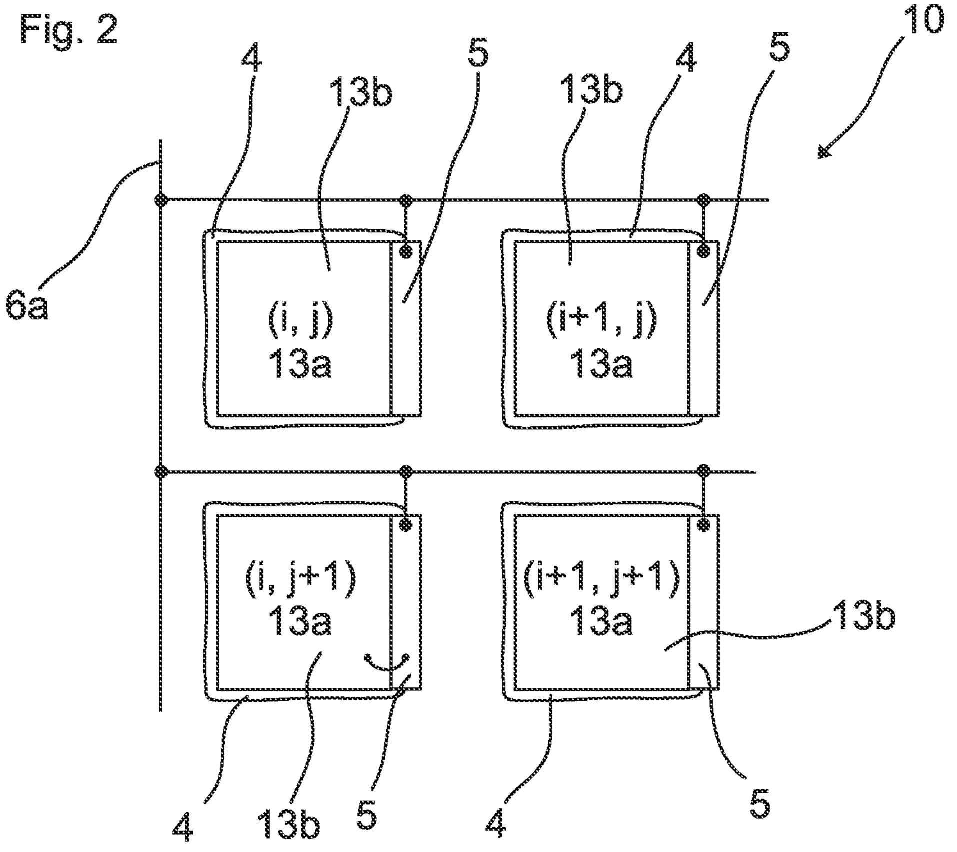
FIG. 2 shows a top view of a breakdown-avalanche photon sensors array according to an embodiment of the invention.

Whereas FIG. 1 shows the array 10 of sensitive breakdown avalanche photon sensor 13 in a side cutaway view, FIG. 2 shows a top view of the array 10 of the breakdown avalanche photon sensors 13. Herein, a top view 13*a* of the breakdown-avalanche photon sensor 13 is shown, wherein the depicted embodiment comprises a square shaped photosensitive area 13*b*. As can be seen in the top view shown in FIG. 2, the optical protection trenches 4 encircle the photosensitive areas 13*b*, inside the epitaxy layer 12. Also shown in FIG. 2 is the quenching element 5, which is arranged along one side of the sensitive area 13*b*. The quenching element 5 is arranged outside the photosensitive area 13*b* of the breakdown avalanche photon sensor 13 on the top of epitaxy layer 12. Furthermore, the quenching element 5 is connected to the rest of the breakdown avalanche photon sensor 10 via an electrical conductor 6*a*.

The structure of sensor breakdown avalanche photon sensors array 10, especially the substrate 11, the epitaxial layer 12, the breakdown avalanche photon sensor 13, comprise various types of semiconductor materials. In detail, the semiconductor substrate 11 comprises a p-doped semiconductor material. The epitaxial layer 12 comprises a high quality p-doped semiconductor material. The lower layer 2*b* of the breakdown avalanche photon sensor 13 comprises a n-doped (n-Well) semiconductor material. Alternatively, the lower layer 2*b* comprises a p-doped semiconductor material. The upper layer 2*a* of the breakdown avalanche photon sensor 13 comprises a heavily p-doped (p+) semiconductor material. Alternatively, the upper layer 2*a* comprises a heavily n-doped (n+) semiconductor material. Herein, upper and lower layers 2*a*, 2*b* form the pn-junction 2*c*. The pn-junction 2*c* is surrounded by the guard ring 3 p-doped (p-Well) semiconductor material. In detail, the guard ring 3 extends further into the breakdown avalanche photon sensor 13 and towards epitaxy layer 12 than the upper layer 2*a*. The pn-junction 2*c* and the quenching element 5 are serially connected. Due to the further extension of the guard ring 3, a breakdown in the pn-junction 2*c* will more likely occur in a central sensitive area of the breakdown avalanche photon sensor 13 than at the edges of the pn-junction 2*c* towards the optical protection trench 4. Thus, a premature breakdown may be omitted due to the guard ring 3. Furthermore, due to the further implementation of the optical protection trench 4, optical crosstalk with breakdown avalanche photon sensors 13 neighboring breakdown-avalanche photon sensors 13 may be suppressed especially in the region of the pn-junction 2*c*. In the case of an incoming photon, this may most likely be absorbed in a region of the epitaxial layer 12. Operating the breakdown avalanche photon sensor 13 in breakdown mode, i.e., when applying sufficiently high reverse bias voltage to the pn-junction 2*c*, a high electric field created within the pn-junction 2*c* leads to drifting of free charge carriers, electrons and holes in the layer 2*b* of pn-junction of breakdown avalanche photon sensor 13. The region pn-junction 2*c* forms an amplification region, wherein the breakdown-avalanche occurs. Within the amplification region, the breakdown-avalanche photon sensor 13 comprises a high internal amplification gain.

The breakdown-avalanche photon sensor 13, and the guard ring 3 and optical protection trench 5 may be produced within the epitaxial layer 12 on semiconductor substrate 11 of a silicon material and may be processed in CMOS technology. This may give the compatibility with modern integral electronic technology, implementation of processing electronics on the same chip, reduce complexity in production and production costs as well. A width of the optical protection trenches 4 may be chosen such that optical crosstalk may be suppressed sufficiently as well as the total area occupied by the optical protection trench 4 within the breakdown-avalanche photon sensors array 10 and with respect to the photosensitive area 13*b* may be minimized. The optical protection trenches 4 are implemented by a shallow trench isolation structure in the CMOS process technique and it may be partially or completely filled with a photo-blocking material, thereby blocking an breakdown-avalanche process. By blocking such a breakdown-avalanche process, optical crosstalk can be suppressed efficiently by the optical protection trench 4.

Figure 3A:
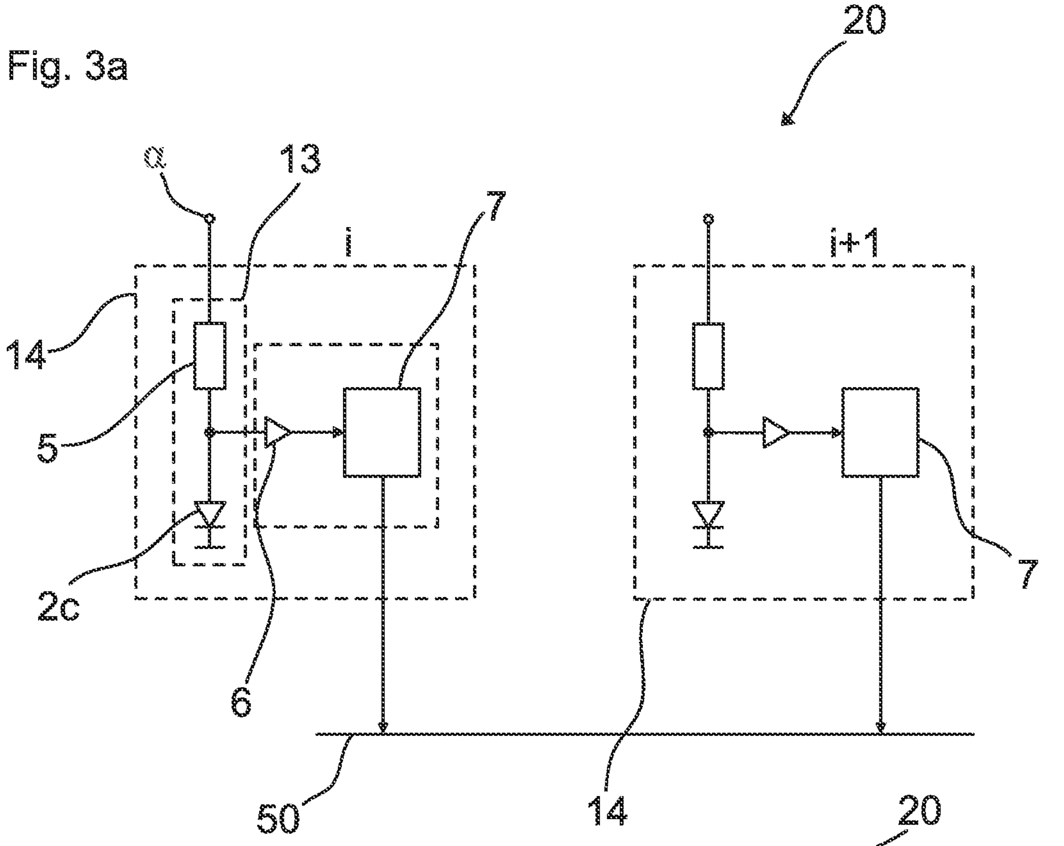
FIG. 3*a* shows an electric circuit diagram of a digital breakdown-avalanche photon sensor according to an embodiment of the invention.

FIG. 3*a* shows a schematic diagram of a digital breakdown-avalanche photon sensors array 20 according to an embodiment of the invention. The digital breakdown-avalanche photon sensors array 20 shown in FIG. 3*a* shows two digital breakdown-avalanche photon sensors 14, number i and i+1. The digital breakdown-avalanche photon sensor 14 comprises the breakdown-avalanche photon sensor 13, comprising a pn-junction 2*c* and quenching element 5, and a discriminator 6. Furthermore, the digital breakdown-avalanche photon sensors 14 comprises a memory 7, for instance a one-bit memory unit. The input of the discriminator 6 is connected to the breakdown-avalanche photon sensor 13, especially to the quenching element 5 of the breakdown avalanche photon sensor 13. Furthermore, a schematic of the breakdown-avalanche photon sensor 13 shown in FIG. 3. The p-doped side of the pn-junction 2*c*, in other words upper layer 2*a* of the pn-junction 2*c*, is connected through quenching element 5 to an electric bias and to an input of the digital discriminator 6. The input of memory 7 is connected to the output of the discriminator 6 and the memory 7 is further connected to digital data bus 50. The memories 7 of the two digital breakdown-avalanche photon sensors 14 are connected via the digital data bus 50. A power enable signal may control the digital breakdown-avalanche photon sensor 14. Therefore, when the power enable signal for a certain digital breakdown-avalanche photon sensor 14 is high, the breakdown-avalanche photon sensor 13 of the corresponding digital breakdown-avalanche photon sensor 14 is ready to detect a photon, i.e., be in a response state. When the power enable control signal is low, the breakdown-avalanche photon sensor 13 is not ready to detect a photon, i.e., be in a silent state. In the response state, when operating the breakdown-avalanche photon sensor 13 in breakdown mode, the quenching element 5 is configured to stop or quench the breakdown-avalanche process. Herein, the quenching element 5 may be one of a passive or active quenching element, i.e., either a quenching resistance or a quenching electronic circuit. When a photon is detected by the breakdown-avalanche photon sensor 13, the breakdown-avalanche photon sensor 13 may enter the silent state. Herein, as the quenching element 5 is in series with the pn-junction 2*c* of the breakdown-avalanche photon sensor 13, the quenching element 5 is configured to terminate the breakdown-avalanche process and restore the breakdown-avalanche photon sensor 13 into the response state, waiting for the next photon to be detected. In order for the breakdown-avalanche photon sensor 13 and especially the pn-junction 2*c* to be operated in the breakdown mode, a first electrical contact α may form a cathode terminal being connected to a power enable control signal terminal. The p-doped area of the pn-junction 2*c*, also the anode terminal of the pn-junction 2*c*, is electrically connected to the quenching element 5 and to the discriminator 6. Upon breakdown-avalanche within the pn-junction 2*c*, a current is flowing through the pn-junction 2*c*. The discriminator 6 is configured to receive this current and determine whether said current exceeds a threshold value. In case the current exceeds the threshold value, the discriminator 6 is configured to output a binary value corresponding to a detected photon, i.e., the value of 1; in the other case, the discriminator 6 is configured to output the value of 0. Herein, the discriminator 6 is configured to determine a binary value from an analogue pulse signal, i.e., the current flowing through the pn-junction 2*c* of the breakdown avalanche photon sensor 13. Furthermore, as the discriminator 6 is electrically connected to the memory 7, the digitalized signal determined by the discriminator 6 is stored in the memory 7. It is to be noted, that in another embodiment, the threshold of the discriminator 6 may also be a voltage threshold in contrast to the herein described current threshold. Each digital breakdown-avalanche photon sensor 14 relates to one digital memory circuit unit 7. In other words, for each digital breakdown-avalanche photon sensor 14, there is one-bit memory 7 provided. Hence, a photon detected by a digital breakdown-avalanche photon sensor 14 leads to a generation of a digitalized signal within the digital breakdown-avalanche photon sensor 14, and the digitalized signal is being stored in the memory 7 of the digital breakdown-avalanche photon sensor 14. Moreover, the memory 7 may store further information as described later.

Figure 3B:
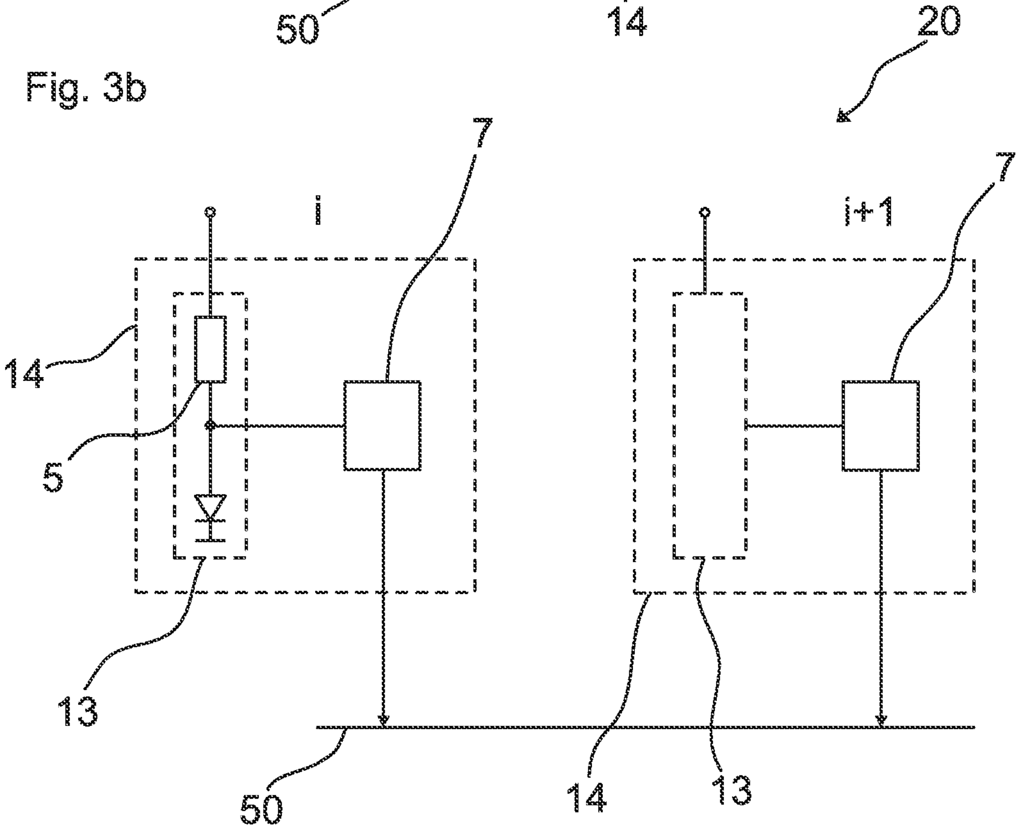
FIG. 3*b* shows an electric circuit diagram of a digital breakdown-avalanche photon sensor according to an embodiment of the invention.

FIG. 3*b* shows a related embodiment, though without the discriminator 6. Herein, the memory 7 of each digital breakdown-avalanche photon sensor 14 is directly connected with the quenching element 5 and the pn-junction 2*c*.

Figure 4:
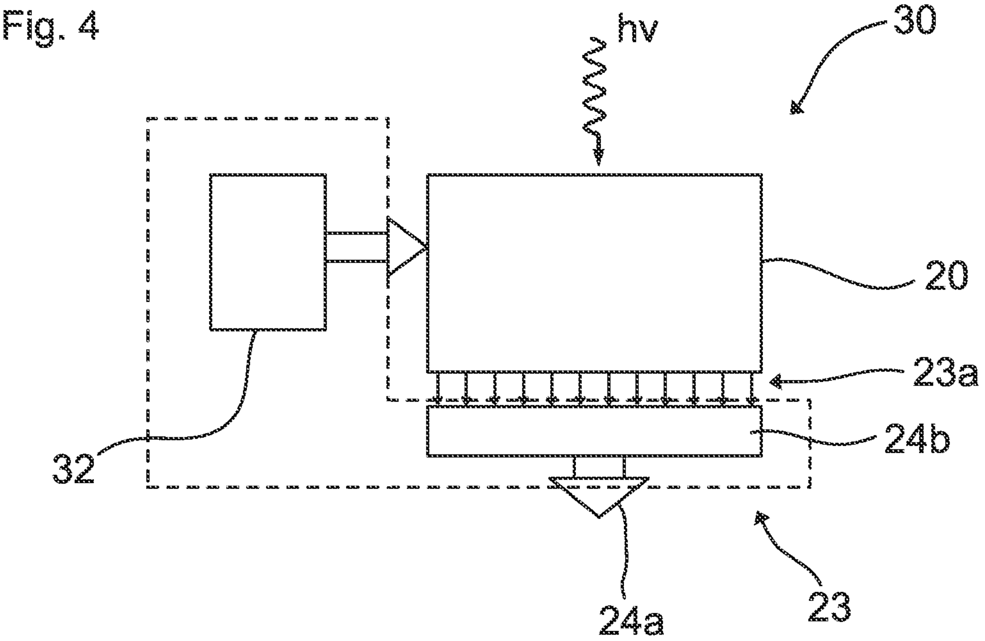
FIG. 4 shows a schematic of a digital photomultiplier photon counter according to an embodiment of the invention.

FIG. 4 shows a schematic of a digital photomultiplier photon counter 30. The digital photomultiplier photon counter 30 comprises a digital control unit 32 which is connected with the digital breakdown-avalanche photon sensors array 20. The digital control unit 32 is configured to send reading signals to the digital breakdown-avalanche photon sensors array 20. The digital photomultiplier photon counter 30 further comprises a digital data bus 23*a*, which connects digital output busses 24*b* with a final digital output bus 24*a*. The digital output busses 24*b* and the final digital output bus 24*a* form an output unit 23.

Figure 5:
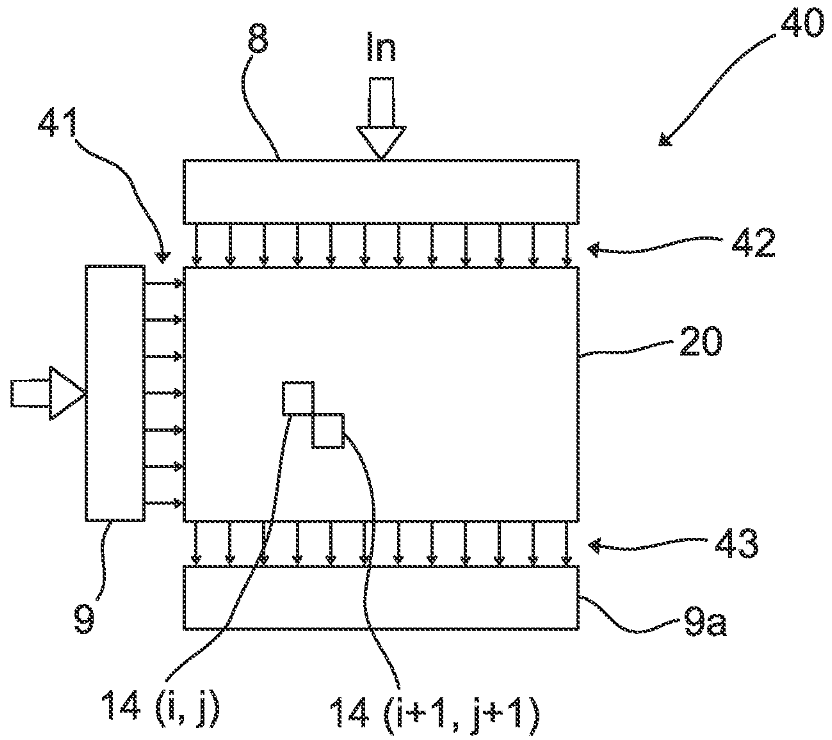
FIG. 5 shows a schematic of a digital photomultiplier imager according to an embodiment of the invention.

FIG. 5 shows a schematic of a digital photomultiplier imager 40 according to an embodiment of the invention. The imager 40 comprises a digital breakdown-avalanche photon sensors array 20. The breakdown-avalanche photon sensors array 20 comprises a two-dimensional array of digital breakdown-avalanche photon sensors 14. For explanation, in FIG. 5 are shown two digital breakdown-avalanche photon sensors, 14(*i,j*) and 14 (*i*+1,*j*+1). The digital breakdown-avalanche photon sensors 14 are electrically connected with each other. In the memory 7 of each digital breakdown-avalanche photon sensor 14, a physical position of the corresponding digital breakdown-avalanche photon sensor 14 within the array 20 is defined aa an image coordinate information. This physical position of the digital breakdown-avalanche photon sensor 14 corresponds to an address information of the corresponding digital breakdown-avalanche photon sensor 14 within the pixel array 20. All processing electronics are implemented on the same epitaxial layer 12. According to this embodiment, the imager 40 comprises one digital row decoder unit 8, and one digital column decoder unit 9 and an output readout circuit 9*a*. The digital decoder units 8, 9 and the output readout circuit 9*a* are connected to the array 20 via digital address units 41, 42, 43.

REFERENCE SIGNS

- 2*a* upper layer of breakdown-avalanche photon sensor
- 2*b* lower layer of breakdown-avalanche photon sensor
- 2*c* (schematic of) pn-junction
- 3 guard-ring (n-doped)
- 4 optical protection trenches
- 5 quenching element
- 6 discriminator
- 6*a* electrical conductor
- 7 digital memory
- 8 digital row decoder unit
- 9 digital column decoder unit
- 9*a* output readout circuit
- 10 breakdown-avalanche photon sensors array
- 11 semiconductor substrate (p+-doped)
- 12 (semiconductor) epitaxial layer (p-doped)
- 13 breakdown-avalanche photon sensor
- 13*a* breakdown-avalanche photon sensor (top view)
- 13*b* photosensitive area of breakdown-avalanche photon sensor
- 13*c* upper end of breakdown avalanche photon sensor
- 14 digital breakdown-avalanche photon sensor
- 20 digital breakdown-avalanche photon sensors array
- 23 output unit
- 23*a* digital data bus
- 24*a* final digital output bus
- 24*b* digital output busses
- 32 digital control unit
- 40 digital photomultiplier imager
- 41, 42 digital address unit
- 43 digital address unit
- 50 digital data bus
- α first electrical contact

What is claimed is:

1. A breakdown-avalanche photon sensors array, which is implemented in CMOS (complementary metal-oxide semiconductor) technology, wherein the breakdown-avalanche photon sensors array has single photon sensitivity, comprising:

a semiconductor substrate; and an epitaxial layer, which is located above the semiconductor substrate; and a breakdown-avalanche photon sensor, which is located within the epitaxial layer, wherein the breakdown-avalanche photon sensor comprises:

a guard ring;

a lower layer and an upper layer within the epitaxial layer, which form a sensitive breakdown-avalanche pn-junction, wherein the guard ring is located within the epitaxial layer;

wherein the guard ring is configured for suppression of a breakdown-avalanche process at edges of the breakdown-avalanche photon sensor due to a weaker electric field near a guard ring area compared to an electric field within a central region of the pn-junction; and a quenching element, which is electrically connected to an area of the pn-junction of the breakdown-avalanche photon sensor, wherein the quenching element is configured for quenching the breakdown-avalanche photon sensor after detection of a photon.

2. The breakdown-avalanche photon sensors array according to claim 1, wherein the breakdown-avalanche photon sensors array further comprises:

optical protection trenches, wherein at least one optical protection trench is located around the photosensitive area of at least one breakdown-avalanche photon sensor of the breakdown-avalanche photon sensors array and wherein the trenches are configured to suppress optical crosstalk.

3. The breakdown-avalanche photon sensors array according to claim 2, wherein the photosensitive area defines an upper end of the breakdown-avalanche photon sensor in at least a portion of the breakdown-avalanche photon sensors array, and wherein at least one of the optical protection trenches extend further from the upper end than a pn-junction of the breakdown-avalanche photon sensor.

4. A digital breakdown-avalanche photon sensor, comprising:

a breakdown-avalanche photon sensor comprising:

a guard ring;

a lower layer and an upper layer within the epitaxial layer, which form a sensitive breakdown-avalanche pn-junction, wherein the guard ring is located within the epitaxial layer;

wherein the guard ring is configured for suppression of a breakdown-avalanche process at edges of the breakdown-avalanche photon sensor due to a weaker electric field near a guard ring area compared to an electric field within a central region of the pn-junction; and a quenching element, which is electrically connected to an upper area of the pn-junction of the breakdown-avalanche photon sensor, wherein the quenching element is configured for quenching the breakdown-avalanche photon sensor after detection of a photon; and a digital memory, wherein the memory is electrically connected to the breakdown-avalanche photon sensor, and wherein, upon photo detection by the breakdown-avalanche photon sensor, the breakdown-avalanche photon sensor is configured to generate a signal and send the signal to the digital memory, and wherein the digital memory is configured to store the signal as data information.

5. The digital breakdown-avalanche photon sensor according to claim 4, further comprising a discriminator, which is configured to perform digitalization of the signal generated by the breakdown-avalanche photon sensor and wherein the discriminator is further configured to send the digitalized signal to the digital memory.

6. The digital breakdown-avalanche photon sensor according to claim 5, wherein the breakdown-avalanche photon sensor, the discriminator and the digital memory are implemented within an epitaxial layer on a substrate using CMOS (complementary metal-oxide semiconductor) technology.

7. A digital breakdown-avalanche photon sensors array, comprising:

at least a one-dimensional array of digital breakdown avalanche photon sensors comprising:

a breakdown-avalanche photon sensor, wherein the breakdown-avalanche photon sensor comprises:

a guard ring;

a lower layer and an upper layer within the epitaxial layer, which form a sensitive breakdown-avalanche pn-junction, wherein the guard ring is located within the epitaxial layer;

wherein the guard ring is configured for suppression of a breakdown-avalanche process at edges of the breakdown-avalanche photon sensor due to a weaker electric field near a guard ring area compared to an electric field within a central region of the pn-junction; and a quenching element, which is electrically connected to an area of the pn-junction of the breakdown-avalanche photon sensor, wherein the quenching element is configured for quenching the breakdown-avalanche photon sensor after detection of a photon; and a digital memory, wherein the memory is electrically connected to the breakdown-avalanche photon sensor, and wherein, upon photo detection by the breakdown-avalanche photon sensor, the breakdown-avalanche photon sensor is configured to generate a signal and send the signal to the digital memory, wherein the digital memory is configured to store the signal as data information; and wherein processing electronics of the digital breakdown avalanche photon sensors array are electrically connected with each other.

8. The digital breakdown-avalanche photon sensors array according to claim 7, wherein the processing electronics of the digital breakdown-avalanche photon sensors array are implemented within an epitaxial layer on a substrate in accordance with CMOS (complementary metal-oxide semiconductor) technology.

9. The digital breakdown-avalanche photon sensors array according to claim 7, further comprising digital processing electronics providing as output information a number of photons detected at a particular time;

wherein the digital breakdown-avalanche photon sensors array is a digital photomultiplier photon counter.

10. A digital photomultiplier imager comprising:

a digital breakdown-avalanche photon sensors array according to claim 7; and processing electronics, which are electrically connected to the digital breakdown-avalanche photon sensors array and wherein the processing electronics are configured to read data information and address information from digital memories of the digital breakdown-avalanche photon sensors array, and send it to a digital output unit, which is electrically connected to the digital breakdown-avalanche photon sensors array, and wherein the digital output unit is configured to store data information and address information read from memory by the processing electronics of the digital breakdown-avalanche photon sensors array.

11. The digital photomultiplier Imager according to claim 10, wherein the digital processing electronics comprise:

a digital address unit, which is communicatively coupled with the digital breakdown-avalanche photon sensors array and wherein the digital address unit is configured to determine address information of processing electronics in the digital breakdown-avalanche photon sensors array; and digital processing electronics, which are configured to control the process of reading and transferring data information from the digital breakdown-avalanche photon sensors array corresponding to determined address information, wherein the digital address units and the digital breakdown-avalanche photon sensors array are electrically connected with each other.

12. The digital photomultiplier Imager according to claim 10, wherein the processing electronics further comprises:

at least one digital row decoder unit, wherein the digital row decoder unit is electrically connected to rows of the digital breakdown-avalanche photon sensors array; and at least one digital column decoder unit, wherein the digital column decoder unit is electrically connected to columns of the digital breakdown-avalanche photon sensors array, and wherein the digital processing electronics are electrically connected to the at least one digital row decoder unit and to the at least one digital column decoder circuit, and wherein the digital processing electronics are configured to send a reading signal to the digital row decoder and digital column decoder units corresponding to determined address information, and wherein, upon sending the reading signal, the digital row decoder unit is configured to send a row strobe signal according to determined address information to the digital breakdown-avalanche photon sensors array and the digital column decoder unit is configured to send a column strobe signal according to determined address information to the digital breakdown-avalanche photon sensors array.

13. The digital photomultiplier Imager according to claim 10, wherein the processing electronics are configured to read data information from at least two memories.

14. The digital photomultiplier Imager according to claim 10, wherein the output unit is configured to suppress a dark rate within the epitaxial layer.

15. The digital photomultiplier Imager according to claim 10, wherein the processing electronics and the output unit are implemented within the epitaxial layer in accordance with CMOS (complementary metal-oxide semiconductor) technology.

* * * * *